United States Patent [19]

Iwase et al.

[11] Patent Number: 5,173,912
[45] Date of Patent: Dec. 22, 1992

[54] DOUBLE-CARRIER CONFINEMENT LASER DIODE WITH QUANTUM WELL ACTIVE AND SCH STRUCTURES

[75] Inventors: Masayuki Iwase, Tokyo; Michinori Irikawa, Yokohama, both of Japan; Randit S. Mand, San Jose, Calif.

[73] Assignee: The Furukawa Electric Co., Ltd., Tokyo, Japan

[21] Appl. No.: 677,733

[22] Filed: Apr. 2, 1991

[51] Int. Cl.$^5$ ............................................... H01S 3/19
[52] U.S. Cl. ..................................................... 372/45
[58] Field of Search ............................... 372/45, 44, 46

[56] References Cited

U.S. PATENT DOCUMENTS

| | | | |
|---|---|---|---|
| 4,999,844 | 3/1991 | Imamoto | 372/45 |
| 5,003,548 | 3/1991 | Bour et al. | 372/45 |
| 5,020,068 | 5/1991 | Isshiki | 372/45 |

Primary Examiner—James W. Davie
Attorney, Agent, or Firm—Jacobson, Price, Holman & Stern

[57] ABSTRACT

A semiconductor laser diode of pn double hetero junction type which comprises a first active layer formed on a substrate for imparting a main oscillation, a second active layer adjacent to the first active layer in such a manner that at least one of the first and second active layers is formed of a multi quantum well or single quantum well structure, an intermediate clay layer interposed between the first active layer and the second active layer for preventing duplication of wave function of confined electrons of the respective active layers, and a graded refractive index distribution region (GRIN-SCH structure layer) provided on at least one of under the first active layer and over second active layer to reduce the refractive index thereof remotely from the active layers. Thus, the semiconductor laser diode can have high characteristic temperature and lower a threshold current at the time of laser oscillation and obtain preferable operation characteristics even under severe environments of temperature condition.

3 Claims, 4 Drawing Sheets

DOUBLE-CARRIER CONFINEMENT LASER DIODE WITH QUANTUM WELL ACTIVE AND SCH STRUCTURES

BACKGROUND OF THE INVENTION

1. Field of the Invention

This invention relates to a semiconductor laser diode used as a source of light for an optical communication and, more particularly, to a semiconductor laser diode which has excellent temperature characteristics and low threshold current.

2. Description of the Prior Art

There have been a semiconductor laser diode of the type for a short wavelength region ($\lambda = 0.78 - 0.89$ μm) and a semiconductor laser diode of the type for a long wavelength region ($\lambda = 1.2 - 1.6$ μm). The temperature characteristics of a semiconductor laser diode of the type for the long wavelength region used mainly for an optical communication are deteriorated as compared with that for the short wavelength region. This causes drastic increase of threshold current and drastic decrease of differential quantum efficiency at higher temperature.

The threshold current of a laser diode is represented by an equation (1) as shown below, where operating threshold current $I_{th}$ is a function of a temperature T in Kelvin, and $T_0$ denotes characteristic temperature in Kelvin.

$$T_{th} = I_{th0} \cdot exp(T/T_0) \tag{1}$$

As is understood from the above equation (1), a semiconductor laser diode having high characteristic temperature $T_0$ is excellent due to its stable temperature characteristics.

In case of an AlGaAs (ternary crystalline solid solution) short wavelength band semiconductor laser diode, the characteristic temperature $T_0$ is usually larger than 150 K.

On the other hand, in an InGaAsP (quaternary crystalline solid solution) long wavelength region semiconductor laser diode, $T_0$ is as low as 60 K in the temperature range 0° C.–40° C., and it deteriorates further at higher temperature region.

Further, in case of a long wavelength region semiconductor laser diode having an active layer of a quantum well structure, $T_0 = 150$ K at lower temperature region than 40° C., but $T_0$ is as low as 60 K at higher temperature than 40° C.

The dominant reason of the low characteristic temperature of the long wavelength region semiconductor laser diode is attributed to the carrier (electron) overflow from active layer to p-clad layer generated by Auger recombinations.

(Reference 1. Longwavelength Semiconductor Lasers, Agrawal and Outta, Van Nostrand Reinhold Company, N.Y. pp 71-141.)

In order to prevent such a carrier loss, "Double Carrier Confinement "(DCC)" hetero junction" has been proposed, and the following reference 2 is disclosed with respect to this.

Reference 2: IEEE J. Quantum Electron., Vol. QE-19, pp.1319-1327.

A representative DCC structure disclosed in the reference 2 will be described with reference to FIG. 5.

In case of a DCC structure shown in FIG. 6, an N-type InP clad layer 2, an InGaAsP first active layer 3, a p-type InP intermediate clad layer 4, a p-type InGaAsP second active layer 5, a p-type InP clad layer 6, a p-type InGaAsP contact layer 7, an n-type InP block layer 8 and are sequentially grown on an n-type InP substrate 1.

As is apparent from FIG. 7, in a long wavelength region semiconductor laser diode having such a DCC structure, its characteristic temperature $T_0 = 130-210$ K up to the vicinity of 80° C. Therefore, the temperature characteristics are remarkably improved as compared with the conventional DH structure.

The reason for the improvement is considered as follows.

In the long wavelength region semiconductor laser diode, a material of InGaAsP/InP has larger generation of high energy hot electrons due to Auger recombinations as compared with that in GaAs/GaAlAs material system. Thus, as described above, hot electrons can overflow from active layer to p-type clad resulting lower characteristic temperature. On the contrary, in case of the DCC structure, the overflowed electrons are again trapped by the second active layer which contribute to lasing thereby improving the temperature characteristics.

The above-described conventional DCC structure has improved temperature characteristics. However, such DCC structure still has a problem which is that its threshold current density is still high.

The reason of such a problem is considered as follows. When an injection current is relatively low and carrier injection to the second active layer is small, the second active layer acts as an absorption layer of the light from the first active layer. The absorption of light causes the threshold current density to increase.

SUMMARY OF THE INVENTION

The object of the present invention is to provide a semiconductor laser diode which can eliminate the above problems of the conventional DH and DCC semiconductor laser diodes, and which can not only improve temperature characteristic but also decrease threshold current density.

In order to achieve the above-described and other objects of the present invention, there is provided a semiconductor laser diode of pn double hetero junction type comprising a first active layer formed on a substrate for imparting a main oscillation, a second active layer adjacent to said first active layer in such a manner that at least one of said first and second active layers is formed of a quantum well structure, an intermediate clad layer interposed between said first active layer and said second active layer for preventing duplication of wave function of confined electrons of said respective active layers, and a refractive index distribution region provided on at least one of under said first active layer and over second active layer to reduce the refractive index thereof remotely from said active layers. Operation Since the semiconductor laser diode according to the present invention has the DCC structure, it has improved temperature characteristics as described above.

In the semiconductor laser diode according to the present invention, at least one of the first and second active layers is formed of a quantum well structure.

According to the quantum well structure, a low threshold current is obtained, and an absorption of the light at lasing wavelength is much smaller than that of a bulk active layer.

Therefore, the first active layer formed of the quantum well structure reduces the threshold current density of the semiconductor laser diode, and the second active layer formed of the quantum well structure decreases the absorption of light from the first active layer to prevent the threshold current density due to the absorption loss from increasing.

Further, in the semiconductor laser diode according to the present invention, the refractive index distribution region in which the refractive index is reduced remotely from the active layers, i.e., GRIN-SCH structure (Graded Index Separate Confinement Hetero Structure) is provided on the both sides of two active layers.

According to the GRIN-SCH structure, an optical electric field is effectively confined in the quantum well structure of the active layer, the light confinement factor is proportional to not square but one power of the thickness of the active layer. Accordingly, even if the active layer is thin likewise a single quantum well structure, it can prevent the threshold current density from increasing.

BRIEF DESCRIPTION OF THE DRAWINGS

The above and other objects as well as advantageous features of the invention will become apparent from the following detailed description of the preferred embodiments taken in conjunction with the accompanying drawings.

DESCRIPTION OF THE PREFERRED EMBODIMENTS

Embodiments of a semiconductor laser diodes according to the present invention will now be described with reference to FIGS. 1 and 2.

Figure 1:
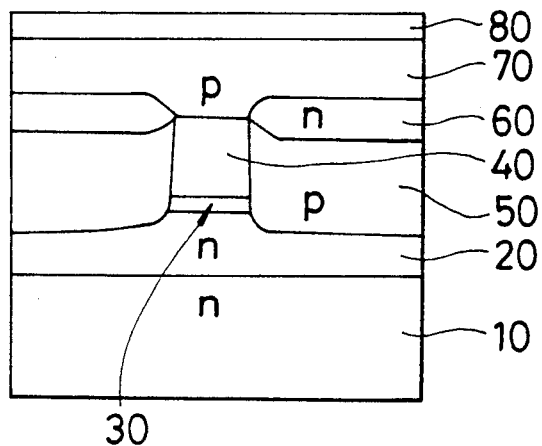
FIG. 1 is a sectional view of an embodiment of a semiconductor laser diode according to the present invention.

In FIG. 1, an n-type InP buffer layer 20, an active layer region 30, a p-type InP clad layer 40, a p-type InP buried layer 50, an n-type InP buried layer 60, a p-type InP clad layer 70, and a p-type InGaAsP contact layer 80 are respectively provided on an n-type InP substrate 10.

Figure 2:
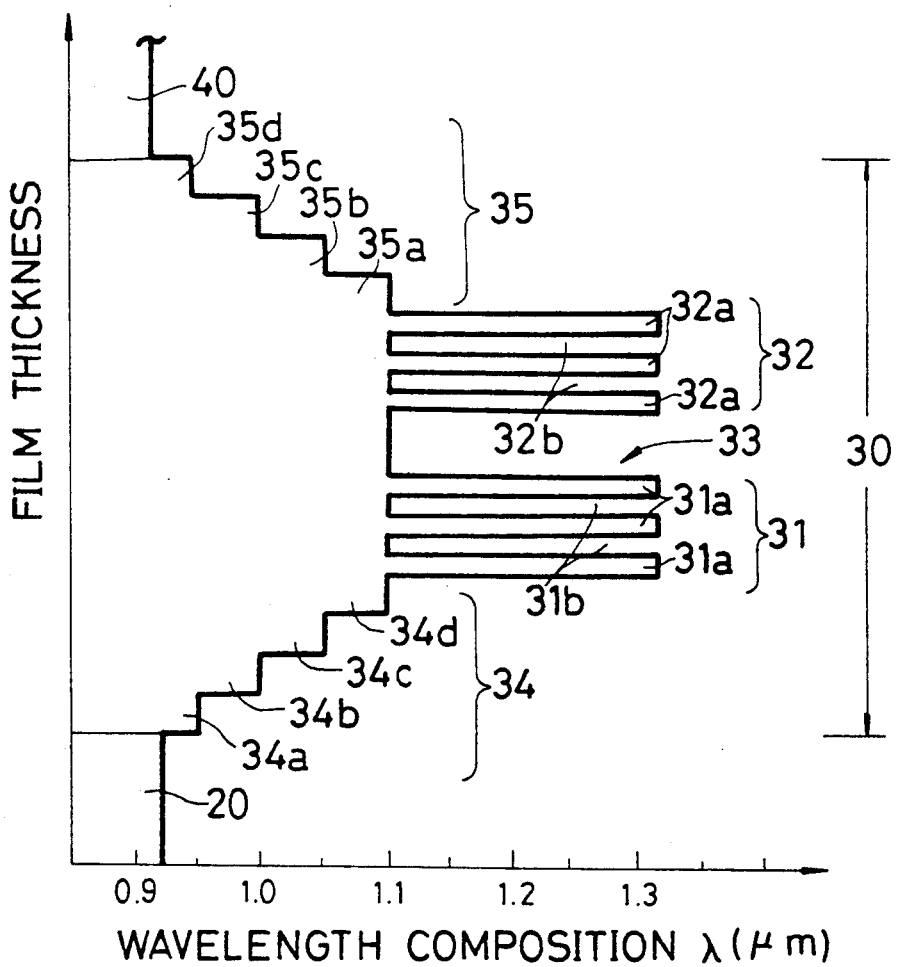
FIG. 2 is a view showing relationship between layer thickness and composition of the semiconductor laser diode of the invention.

The active layer region 30 is composed, as apparent from the relationship between a layer thickness and composition (wavelength λ corresponding to band gap) shown FIG. 2, of undoped first active layer 31 and p-type second active layer 32 formed of quantum well structure, a p-type InP intermediate clad layer 33, a n-type GRIN-SCH structure layer 34 and an p-type GRIN-SCH structure 35.

In the relative relation, the intermediate clad layer 33 is interposed between the first active layer 31 and the second active layer 32 adjacently, one GRIN-SCH structure 34 is provided under the first active layer 31, and the other GRIN-SCH structure 35 is provided on the second active layer 32.

The above-described layers are formed on the n-type InP substrate 10, for example, mainly by a vapor-phase epitaxial method. More specifically, a vapor-phase epitaxial method such as an MOCVD method having excellent controllability for the thickness, composition of a thin film is employed, the layers are formed as below.

An n-type InP buffer layer 20 having $1 \times 10^{18} cm^{-3}$ of carrier concentration and 2 μm of thickness is first grown on an n-type InP substrate 10.

Then, as an n-type GRIN-SCH structure 34 in which its refractive index is reduced gradually from the first active layer 31 to n-InP buffer, a thin film 34a having λ (band gap wavelength) =0.95 μm, a thin film 34b having λ (band gap wavelength) =1.05 μm, a thin film 34c having λ (wavelength composition) =1.0 μm and a thin film 34d having λ (band gap wavelength) =1.1 μm are sequentially formed on an n-type InP buffer layer 20 with carrier concentration $=1 \times 10^{17} cm^{-3}$, thickness =30 nm.

The n-type GRIN-SCH structure layer 34 is formed, for example, of InGaAsP thin films 34a, 34b, 34c and 34d so as to exhibit a quasi-parabolic state.

In this case, when the InGaAsP compositions of the thin films 34a, 34b, 34c and 34d are continuously varied, more preferable n-type GRIN-SCH structure layer 34 is obtained.

Then, a p-type first active layer 31 having a quantum well structure, formed of three wells 31a having λ (band gap wavelength) =1.32 μm and thickness =13 nm, and two barriers 31b having λ (band gap wavelength) =1.1 μm and thickness =15 nm is formed on the n-type GRIN-SCH structure layer 34 corresponding to three periods.

Subsequently, a p-type GaInAsP intermediate clad layer 33 having λ (band gap wavelength) =1.1 μm, carrier concentration $=5 \times 10^{17} cm^{-3}$, thickness =50 nm is laminated on the first active layer 31.

The intermediate clad layer 33 of this case is set to a thickness of about 50 nm as exemplified above so as to prevent duplication of wave functions of electrons of the first and second active layers 31 and 32. Further, in order to sufficiently supply holes to the first active layer 31, InP is Zn-doped as exemplified above.

Then, a p-type second active layer 32 having a quantum well structure, formed of three wells 32a having λ (band gap wavelength) =1.32 μm, thickness =12 nm and two barriers 32b having λ (band gap wavelength) =1.1 μm, thickness =15 nm is grown on the p-type GaInAsP intermediate clad layer 33 similarly corresponding to three periods.

The well width of the p-type second active layer 32 is shortened so that the second active layer has larger confinement energy than that of the first active layer 31.

Therefore, the second active layer 32 acts as an less absorption layer for the light of the first active layer 31.

Subsequently, as an p-type GRIN-SCH structure layer 35 having a refractive index reducing gradually from the second active layer 32 to p-clad layer 40, a thin film 35a having λ (band gap wavelength) =1.1 μm, a thin film 35b having λ (band gap wavelength) =1.0 μm, a thin film 35c having λ (band gap wavelength) =1.0 μm and a thin film 35d having λ (band gap wavelength composition) =0.95 μm are sequentially formed on the first active layer 31 with carrier concentration =1×10$^{17}$cm$^{-3}$, thickness =30 nm.

Further, a p-type InP clad layer 40 is laminated 0.5 μm thick on the p-type GRIN-SCH structure layer 35.

After the layers are formed on the n-type InP substrate 10, SiO$_2$ stripes having 2μm of width along a direction "011" are formed on the epitaxial wafer as etching masks, and layers including p-clad 40, active 30, and the portion of the n-type InP buffer layer 20 are wet etched except the mask portion. Thus, mesa stripes are formed on the n-type InP substrate 10.

Then, a p-type InP buried layer 50 and an n-type InP buried layer 60 are sequentially grown at both sides of the mesa stripes.

Thereafter, the SiO$_2$ mask is removed, and a p-type InP clad layer 70 having carrier concentration =8×10$^{17}$cm$^{-3}$, thickness =2 μm and a p-type InGaAsP contact layer 80 having carrier concentration =1×10$^{18}$cm$^{-3}$, thickness =0.5 μm are sequentially grown on the upper surface of the epitaxial wafer.

Subsequently, the n-type InP substrate 10 is lapped from the rear surface side, the substrate 10 is finished to thickness of 100-150 μm, n-type electrode (not shown) is formed on the rear surface of the substrate, and a p-type electrode (not shown) is formed on the upper surface (contact layer 80 side) of the epitaxial wafer.

The above-described first and second active layers 31 and 32 may have a single quantum well structure or a multiple quantum well structure.

As other embodiment, only one of a first active layer 31 and a second active layer 31 may have a quantum well structure. In this case, a refractive index distribution region (GRIN-SCH structure) is provided at the one active layer side.

When a current is injected between the p-type electrode and the n-type electrode in the semiconductor laser diode shown in FIG. 1, the active layer region 30 radiates a light, the radiated light is reflected and amplified in the active layer region 30 to cause a laser operation therein, and the active layer region 30 inductively irradiates a light therefrom in a predetermined direction.

Since the first and second active layers 31 and 32 are formed of the quantum well structure as described above, the threshold current density is low, the laser light absorption by the second active layer 32 is small, thereby preventing the threshold current density from increasing.

The validity of the GRIN-SCH structure layers 34, 35 are as will be described below.

A mode gain Γgth is balanced with total loss at the threshold of laser oscillation as by the following equation (2), where Γ is light confinement factor of the quantum well structure of the active layer, and g is gain.

$$\Gamma g_{th} = \alpha_i + [(1/L)\ln(1/R)] \quad (2)$$

where $\alpha_i$: loss of waveguide
(1/L) ln (1/R): term indicating reflection loss of resonator mirror
L: length of resonator
R: reflectivity The gain g is represented by the following equation (3) in term of a junction current density J.

$$g = \beta[(\eta_i/d)J - J_0] \quad (3)$$

where β: gain constant
$\eta_i$: internal quantum efficiency
d : thickness of the active layer
$J_0$: current density for forming g =0 condition.

As evident from the equations (2) and (3), if $J = J_{th}$ is satisfied, $g = g_{th}$ is obtained. Therefore, the $J_{th}$ becomes as the following equation (4).

$$J_{th} = (J_0 d/\eta_i) + (d/\eta_i\beta\Gamma)\alpha_i + (d/\eta_i\beta\Gamma)[(1/L)\ln(1/R)] \quad (4)$$

Figure 3:
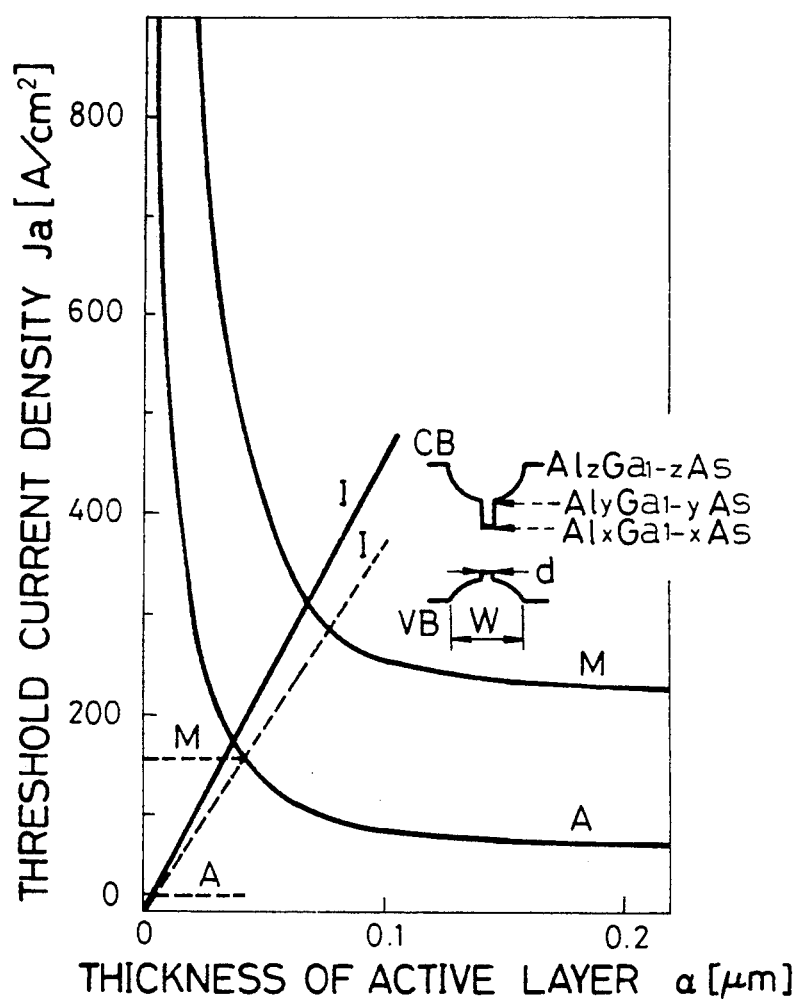
FIG. 3 is a diagram showing relationship between the thickness of the active layer and the threshold current density in the semiconductor laser diode of GRIN-SCH structure.

In the equation (4) described above, the three terms of the right side are respectively an intrinsic term, an absorption term and a mirror loss term, and the dependence on the active layer thickness of the respective terms become as shown in FIG. 3 (refer to reference 3 below).

I = $J_0 d/\eta_i$: intrinsic term
A = $(d/\eta_i\beta\Gamma)\alpha$: absorption term
M = $(d/\eta_i\beta\Gamma)$ [(1/L) ln (1/R)]: mirror loss term Reference 3: Appl. Phys. Lett., Vol 40, No.3, pp.217-219 (1982)

In the conventional DH structure indicated by a solid line in FIG. 3, the Γ is proportional to the square of the d. Accordingly, in case of d <0.07 μm, the absorption term A and the reflection loss term M become larger than the intrinsic term I, and the $J_{th}$ is abruptly raised.

On the contrary, in the GRIN-SCH structure shown by a broken line in FIG. 3, the Γ itself is larger than that of conventional one and (Γ/d) is constant, therefore the absorption term A and the reflection loss term M are constant and smaller than those of conventional one. Accordingly, if the d is reduced, the $J_{th}$ is not raised, but reduced as the intrinsic term I is proportional to d.

In addition, in the laser diode having the quantum well structure, the gain constant β is increased by quantum effect. Therefore, the absorption term A and the mirror loss term M are further reduced.

As described above, the GRIN-SCH structure is associated with the quantum well structure, thereby providing the semiconductor laser diode having low loss and low threshold current density and particularly the GRIN-SCH-MQW laser diode of 1.3 μm region using the InGaAsP.

According to a reference 4 below, the loss α of the waveguide with the GRIN-SCH-MQW laser diode is α=5cm$^{-1}$.

Reference 4: J.J.A.P. Vol 28, No. 4, pp 661-663 (1989).

The above values are ⅓ of those of the conventional bulk DH laser diode.

The reflection loss M of the GRIN-SCH-MQW laser diode can be further reduced by enhancing the reflectivity of the cleaved surface thereof. Therefore, the threshold current can be further reduced in the laser diode.

Furthermore, the reference 4 also discloses that a longitudinal single mode oscillation was observed in a wide temperature range in the GRIN-SCH-MQW-BH laser diode. In a reference 5 below with respect to a DCC structure, it was reported that similar longitudinal single mode oscillation is obtained in a BC type laser diode in which first and second active layers have different widths.

Reference 5: Appl. Phys. Lett., Vol. 42, No. 12, 15 (1982).

From these reports, it is expected that more preferable longitudinal single mode oscillation can be obtained in the MQW-DCC laser diode of the present invention.

Figure 4:
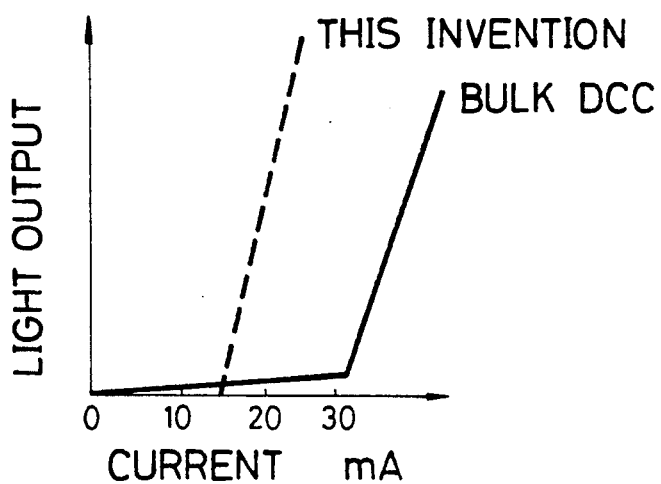
FIG. 4 a view showing optical output-current characteristics of the semiconductor laser diode of the invention and a conventional bulk DCC laser diode.
Figure 5:
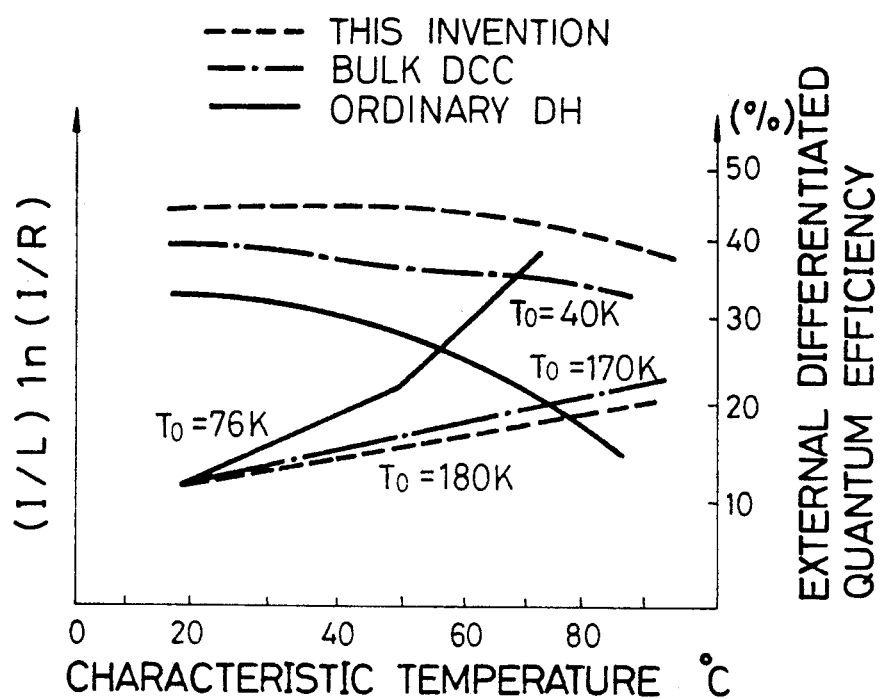
FIG. 5 view showing temperature dependencies of threshold currents and external differential quantum efficiencies of the semiconductor laser diodes of the invention as compared with conventional structures.
Figure 6:
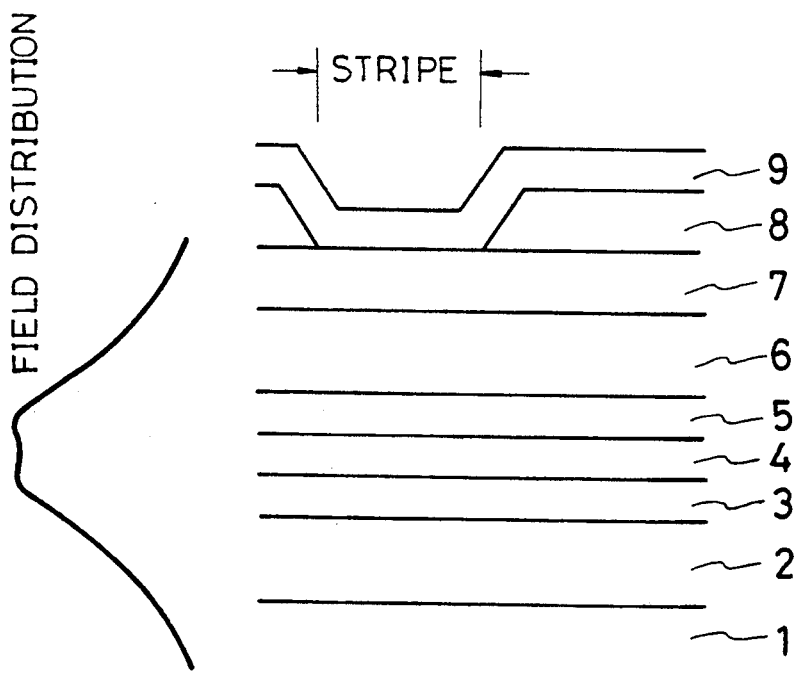
FIG. 6 is a sectional view of a conventional bulk DCC laser diode.
Figure 7:
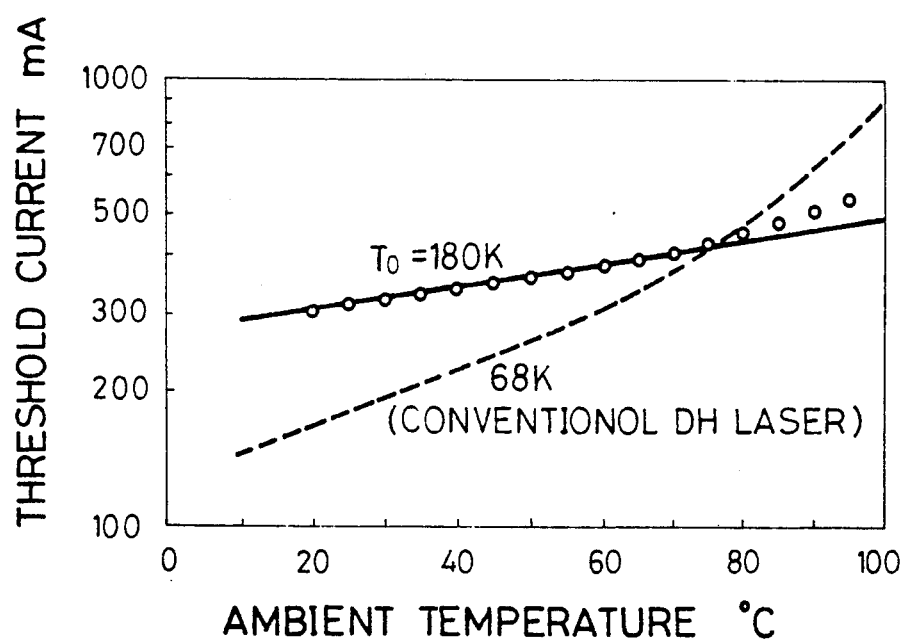
FIG. 7 is a view of comparison of temperature characteristics of a conventional bulk DCC laser diode and an ordinary DH laser diode.

FIG. 4 shows an optical output-current characteristic of a semiconductor laser diode according to the present invention and a conventional bulk DCC laser diode, and FIG. 5 shows temperature dependency characteristic of threshold current and external differential quantum efficiency (per one facet) of the semiconductor laser diode according to the present invention.

In the case of FIG. 5, the variation of the threshold current is expressed by a ratio to a threshold current $I_{th0}$ at 20° C.

The semiconductor laser diode according to the present invention provides of about 15 mA of the threshold current which is about a half of that of a conventional bulk DCC laser diode.

Further, in the case of the semiconductor laser diode according to the present invention, as apparent from FIG. 5, its characteristic temperature $T_0$ is 180 K. This value is equivalent to that of the bulk DCC and more preferable than that of the conventional bulk DH.

The semiconductor laser diode according to the present invention provides a semiconductor laser diode of pn double hetero junction type which comprises a first active layer formed on a substrate, a second active layer adjacent to the first active layer in such a manner that at least one of said first and second active layers is formed of multi quantum well or single quantum well structure, an intermediate clad layer interposed between said first active layer and said second active layer, and a refractive index distribution region provided on at least one of under said first active layer and over second active layer. Therefore, the semiconductor laser diode of the invention can reduce the threshold current at the time of laser oscillation, and obtain preferable operation characteristics even under severe environment of temperature condition.

We claim:

1. A semiconductor laser diode of pn double hetero junction type comprising a first active layer formed on a substrate for imparting a main oscillation, a second active layer adjacent to said first active layer, at least one of said first and second active layers being formed of a multi quantum well or single quantum well structure, an intermediate clad layer interposed between said first active layer and said second active layer for preventing duplication of wave function of confined electrons of said respective active layers, a graded refractive index separate confinement hetero region provided on a least one of under said first active layer and over second active layer to reduce the refractive index thereof remotely from said active layers, mirror means, an n-type electrode formed on a bottom surface of the substrate, and a p-type electrode formed on a upper surface of the intermediate clad layers.

2. A semiconductor laser diode according to claim 1, wherein said first active layer and/or said second active layer is formed of a single quantum well structure.

3. A semiconductor laser diode according to claim 1, wherein said first active layer and/or said second active layer is formed of a multiple quantum well structure.

* * * * *